US006604602B1

(12) United States Patent
Kim

(10) Patent No.: US 6,604,602 B1
(45) Date of Patent: Aug. 12, 2003

(54) SEPARABLE SPEAKER COVER BOX CONTAINING SPEAKER SYSTEM

(76) Inventor: Chae Yong Kim, 1245 St. Andrews Ct., Ontario, CA (US) 91761

( * ) Notice: Subject to any disclaimer, the term of this patent is extended or adjusted under 35 U.S.C. 154(b) by 0 days.

(21) Appl. No.: 10/259,881

(22) Filed: Sep. 30, 2002

(51) Int. Cl.[7] .............................. H04R 1/30; H05K 5/00

(52) U.S. Cl. ........................ 181/199; 181/189; 181/190; 381/351

(58) Field of Search ................................ 181/156, 145, 181/199, 189, 152, 159, 160, 190; 381/349, 350, 351, 339, 340

(56) References Cited

U.S. PATENT DOCUMENTS 3,283,848 A * 11/1966 Patti ........................... 181/145
4,213,515 A * 7/1980 Laupman .................... 181/145
4,432,580 A * 2/1984 Lohmar et al. ............. 181/290
4,598,789 A * 7/1986 Ritter ......................... 181/144
5,110,403 A * 5/1992 Ehlert ..................... 156/580.1
5,416,284 A * 5/1995 Steele et al. ................ 181/199
5,588,065 A * 12/1996 Tanaka et al. ................ 381/96
5,621,804 A * 4/1997 Beppu ........................ 181/145
5,721,401 A * 2/1998 Sim ........................... 181/148
5,760,349 A * 6/1998 Borchers et al. ............ 181/286
5,975,236 A * 11/1999 Yamamoto et al. ......... 181/156
6,031,919 A * 2/2000 Funahashi et al. .......... 181/199
6,203,766 B1 * 3/2001 Kawakami et al. ......... 422/219

FOREIGN PATENT DOCUMENTS

JP 0326789 A * 11/1991 ............ H04R/1/26

* cited by examiner

*Primary Examiner*—Robert E. Nappi
*Assistant Examiner*—Eduardo Colon-Santana

(57) ABSTRACT

A novel speaker box system for a deep bass amplification consists of a front trumpet horned speaker cover box and a rear speaker box. The rear speaker box consists of a cylindrical box and a speaker installed at one end of the cylinder. The other side of the speaker box has a hole for electrical wires to the speaker. The front trumpet horned speaker cover box consists of a cylindrical box and a trumpet. The trumpet is attached to one end of the cylindrical box. The center of the trumpet has an air port connecting the inner side of the trumpet box and the open air. The trumpet horned speaker cover box and the speaker box of this invention are assembled in one set by, including but not limited to, a male thread screw carved on the outside of the speaker box and a female thread screw inside of the trumpet box. Those boxes are assembled in one set for a hip-hop or a rap, which needs a deep bass sound. For a classical music or opera, the bass amplifying trumpet horned speaker cover box is separated from the speaker box.

2 Claims, 4 Drawing Sheets

SEPARABLE SPEAKER COVER BOX CONTAINING SPEAKER SYSTEM

This invention is an improvement of the U.S. Pat. No. 5,418,338 to Kim and relates to a speaker box to which a trumpet box is separably assembled.

BACKGROUND OF THE INVENTION

State of the art speaker boxes have been designed with a large box volume in order to provide greatly amplified bass sound. Many speaker boxes have also been designed with a smaller volume for the purpose of providing a normal amount of bass. Especially for amplifying of a deep bass, very complicate "trumpet" structures are installed inside of a speaker box. While the greatly amplified bass produced by these speaker boxes works well with rap and hip-hop, it does not sound very good with music such as a classic and an opera, which do not require much bass sound. There is no existing speaker box, however, which is capable of providing both a greatly amplified deep bass and a normal bass.

FIELD OF THE INVENTION

The novel cylindrical speaker box is comprised of a speaker section and trumpet horned section, which are separably assembled in one speaker box.

DESCRIPTION OF THE PRIOR ARTS

There are two types of bass amplifying speaker systems; 1) first type applies an air duct at the front of or beside a speaker within a speaker box; 2) the second type develops a complicate paths for sound at the rear end of a speaker.

The state of the art first type of bass amplifying speaker systems is illustrated as follows; U.S. Pat. No. 5,418,338 to Kim illustrates a speaker cover installed over a hole on a speaker box, comprising a transparent plastic outer ring with a hole in the center. U.S. Pat. No. 6,411,721 to Spindler illustrates a speaker having an enclosure in which transducer is mounted at the median point. FIGS. 21, 22, 26, 27, 29, 37, 39, 41, 43 and 44 illustrate similar speaker system, in which a speaker is mounted at the center of the enclosure and some kind of barriers are placed. U.S. Pat. No. 5,588,065 to Tanaka, et al. demonstrates a bass reproduction speaker apparatus, which consists of a cabinet with an opening, a division member inside a speaker unit, and a passive radiator disposed in the opening. In FIG. 9, a port 83 is used instead of the passive radiator. U.S. Pat. No. 5,333,204 to Hamada, et al. introduces a speaker system having a bass-reflex duct, provided in a cabinet at the same plane of the speaker. U.S. Pat. No. 5,150,418 to Honda, et al. illustrates a speaker system, the rearward area of a diaphragm of which, is separated into two acoustic regions. One of the two acoustic regions is a rear opening type and the other is a base-reflex type. U.S. Pat. No. 4,933,982 to Tanaka introduces a bass reflex type speaker system having a duct for transmitting the sound waves. The duct is formed with a plurality of sound paths. U.S. Pat. No. 4,655,315 to Saville illustrates a speaker system comprised of a plurality of serially connected, angularly disposed hollow tubes for enhancing bass sound. U.S. Pat. No. 4,567,959 to Prophit shows a horn loaded bass speaker for use in a limited space. U.S. Pat. No. 4,284,166 to Gale, introduces a port device, which is mounted within bass-reflex speaker enclosures behind port openings. U.S. Pat. No. 4,213,515 to Laupman illustrates a speaker system comprised of an enclosure and at least one speaker. The enclosure includes at least one duct connecting the interior of the enclosure directly with the outer air at the front.

The second type of bass amplifying speaker systems are illustrated in the U.S. Pat. No. 5,637,840 to Kim, U.S. Pat. No. 5,369,712 to Choi, U.S. Pat. No. 5,150,418 to Honda, et al., U.S. Pat. No. 5,025,886 to Jung, U.S. Pat. No. 4,969,196 to Nakamura, U.S. Pat. No. 4,965,837 to Murayama, U.S. Pat. No. 4,454,927 to Seebinger, U.S. Pat. No. 4,205,205 to Babb and U.S. Pat. No. 2,058,555 to Betts, et al.

All of the prior arts illustrate a fixed trumpet like structure installed to the rear side and front side of a speaker or inside a speaker box. None of the prior arts provides a bass amplifier, which is separable from speaker system for a various kinds of music.

SUMMARY OF THE INVENTION

It is the purpose of this invention to provide a novel speaker box system for a deep bass amplification and normal bass to be used within limited space. The speaker box system of this invention consists of a front trumpet horned speaker cover box and a rear speaker box. The rear speaker box consists of a cylindrical box and a speaker installed at one end of the cylinder. The other side of the speaker box has a hole for electrical wires to the speaker. The front trumpet horned speaker cover box consists of a cylindrical box and a trumpet. The trumpet is attached to one end of the cylindrical box. The center of the trumpet has an air port connecting the inner side of the trumpet box and an open air. The trumpet horned speaker cover box and speaker box of this invention are assembled in one set by, including but not limited to, a male thread screw carved on the out side of the speaker box and a female thread screw inside of the trumpet box. Those boxes are assembled in one set, for a hip-hop or a rap, which needs a deep bass sound. For a classic music or opera, the bass amplifying trumpet horned speaker cover box is separated from the speaker box.

BRIEF DESCRIPTION OF THE DRAWINGS

FIG. 3-*b* is a top view of the speaker cover box of this invention.

FIG. 4-*b* is a top view of the speaker box showing speaker.

DETAILED DESCRIPTION OF THE PREFERRED EMBODIMENTS

Figure 1:
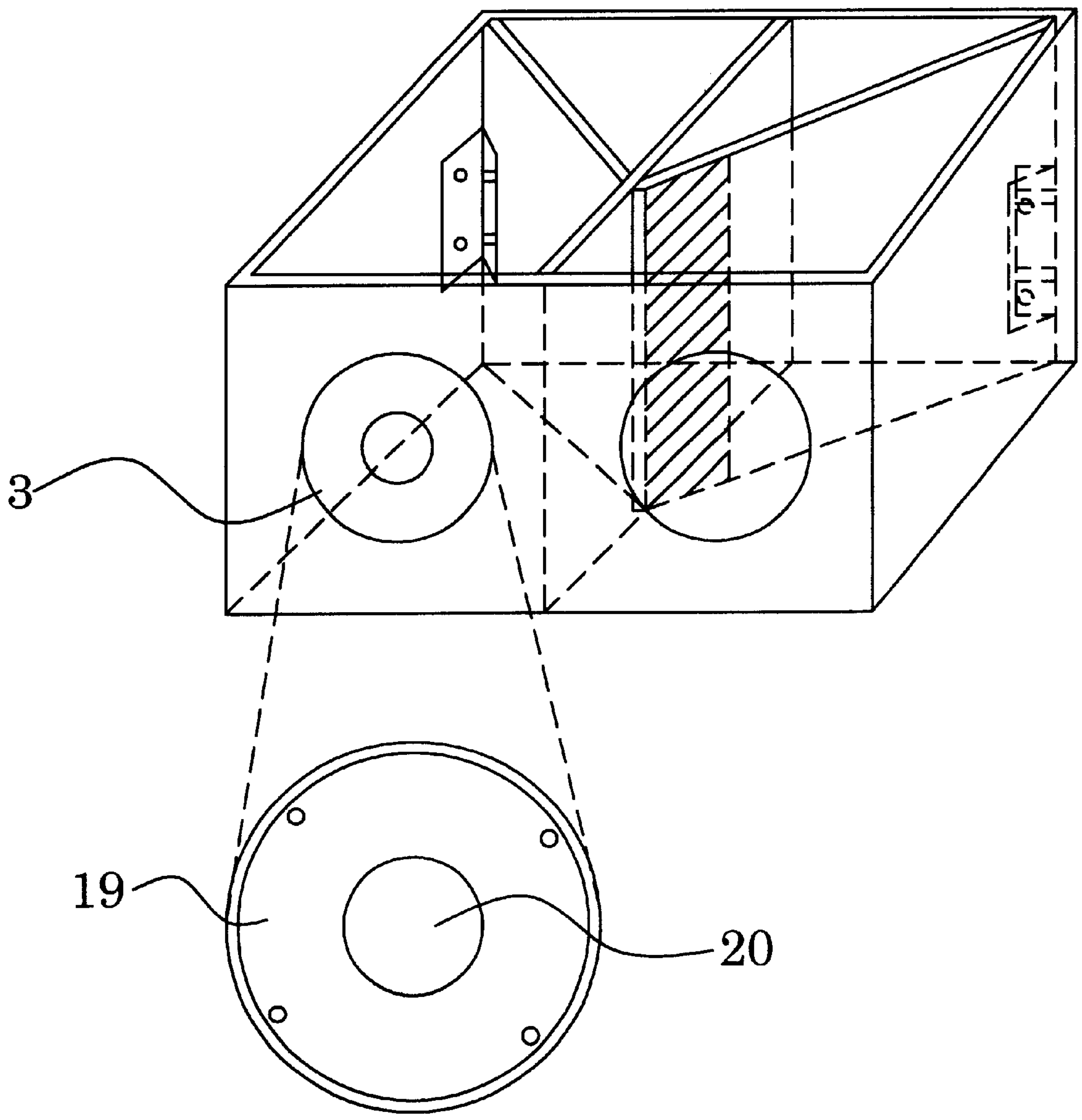
Fig. 1 Prior Art
FIG. 1 is a view of speaker cover with a hole in the center attached to a speaker box in its normal bass mode of prior art (FIGS. 2 and 8 of U.S. Pat. No. 5,418,338).
Figure 2:
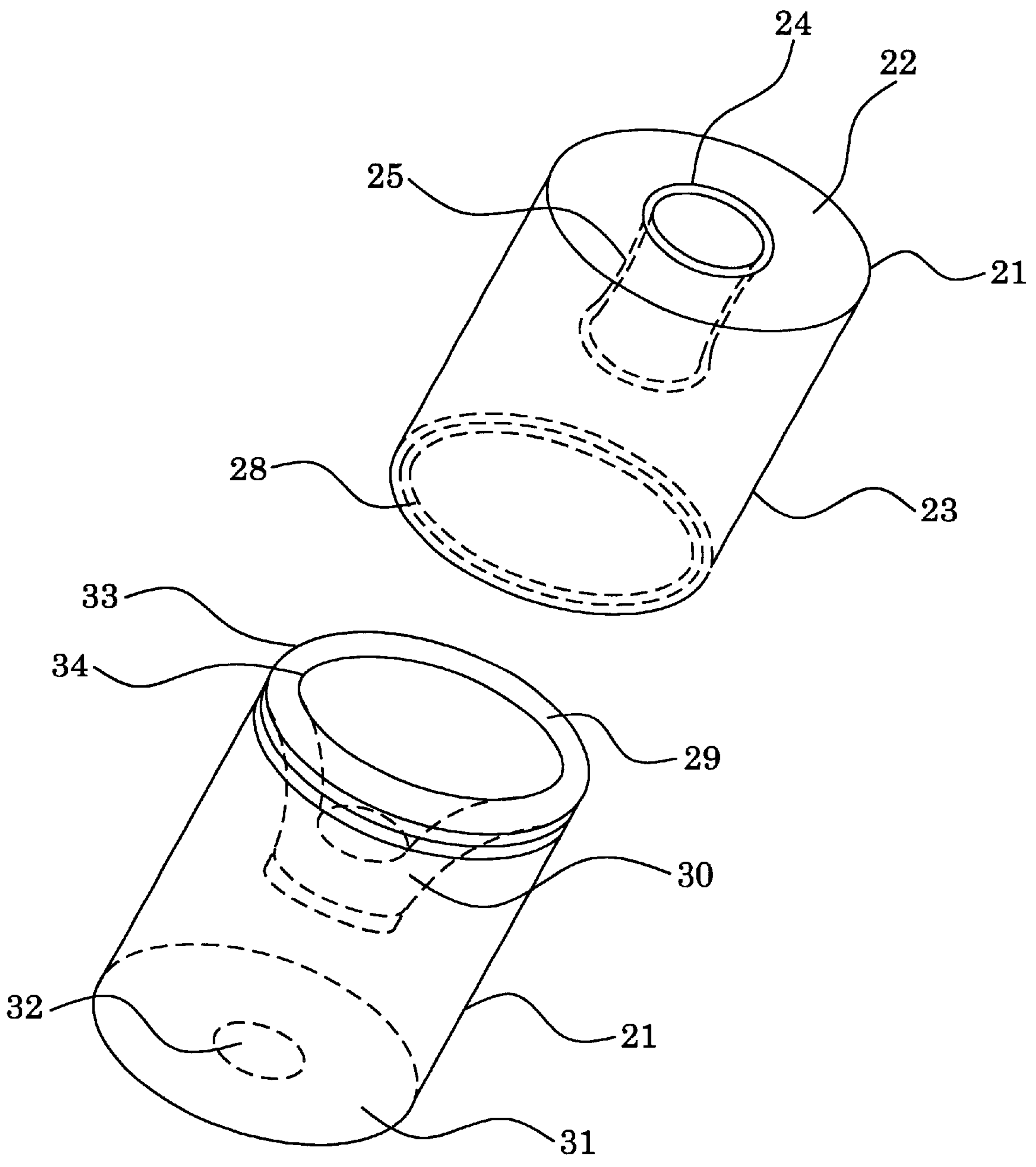
FIG. 2 is a schematic assembly drawing of the speaker box and cover of this invention.

FIG. 1 is a view of speaker cover with a hole in the center attached to a speaker box in its normal bass mode of prior art (FIG. 2 and 8 of U.S. Pat. No. 5,418,338). The speaker cover (19), which has a hole (20) at the center, is attached to a speaker hole (3) at the center of a speaker box (2). Since this speaker cover (19) is a fixed means, it is impossible to control the amplification of the bass without changing the inner volume of the speaker box as shown in the prior art, U.S. Pat. No. 5,418,338.

FIG. 2 is a namely schematic assembly of the speaker box and cover of this invention. The trumpet horned speaker cover box (21) is made of, including but not limited to, a transparent plastic of poly-methylmethacrylate, poly-carbonate, poly-vinyl chloride, a wood, a metal of stainless steel, tin, lead, and a leather with frame.

Figure 3A:
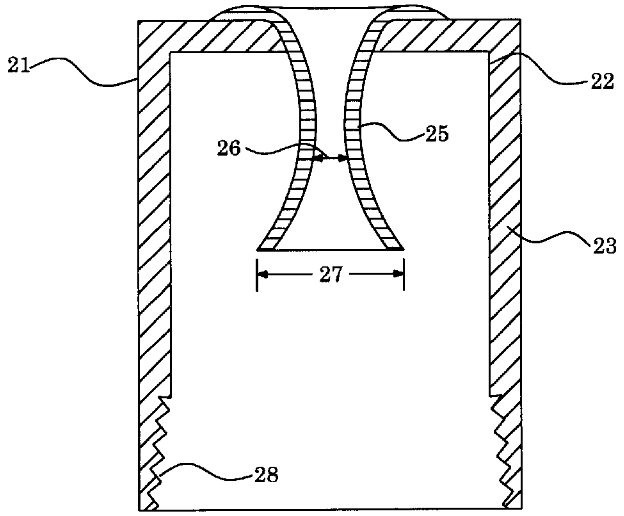
FIG. 3-*a* is a cross sectional view of the speaker cover box of this invention.
Figure 3B:
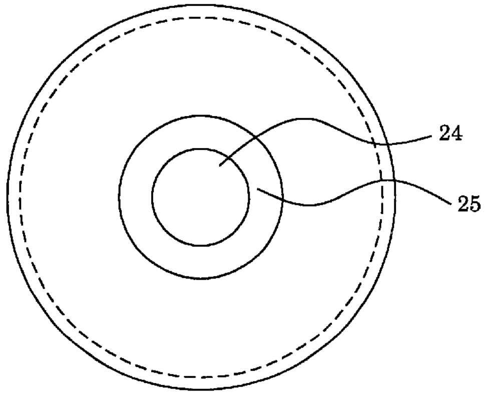

FIG. 3-*a* is a cross sectional view of the speaker cover box (21) of this invention and FIG. 3-*b* is a top view of the speaker cover box (21) of this invention. The height of the speaker cover box (21) is in the range of 10 to 50 cm. Diameter of the speaker cover box (21) is in the range of 10 to 50 cm. Thickness of the cover box material is in the ranges of 0.01 to 5 cm. The upper part (22) of the cover box (21) is blocked with the same material of the cylindrical part (23). The upper part (22) of the cover box (21) has a hole (24) at the center. The diameter of this hole (24) is in the range of 6 to 20 cm. A trumpet horn (25), which has a narrower diameter at the center and broader diameters at the both ends, is affixed into this hole (24). The length of this horn (25) is in the range of 3 to 20 cm. The diameter of this horn (25) at the center (26) is in the range of 2 to 12 cm. The diameter at both ends (27) is in the range of 6 to 20 cm. The diameters of each ends are not necessarily identical. This novel design of horn (25) enables an amplification of a deep bass sound more smoothly without noise compared with the straight air duct of prior arts of U.S. Pat. No. 6,411,721 to Spindler and U.S. Pat. No. 5,588,065 to Tanaka, et al. A female thread screw (28) is carved at the inside of the lower part of the cover box (21).

Figure 4A:
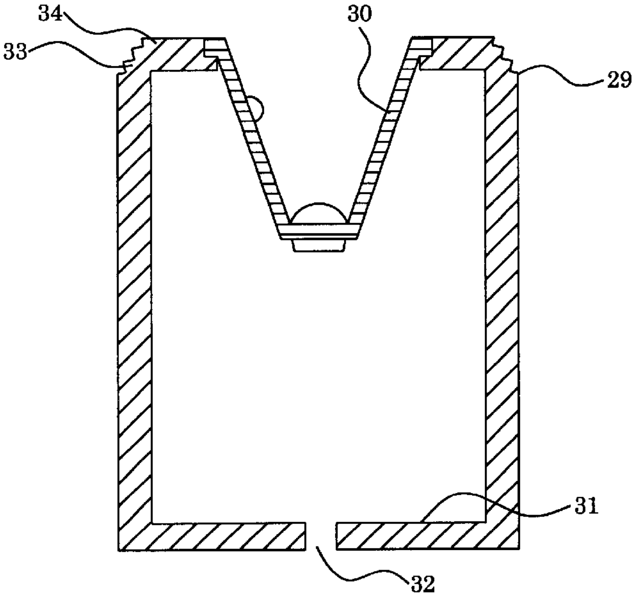
FIG. 4-*a* is a cross sectional view of the speaker box of this invention.
Figure 4B:
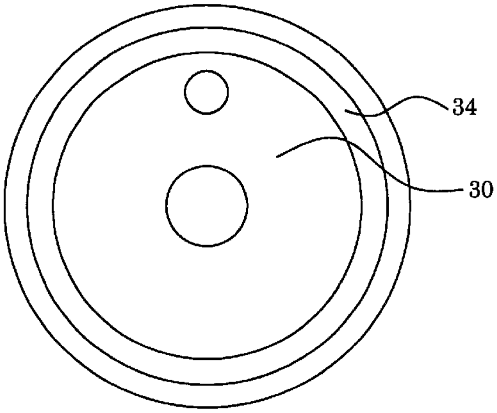

FIG. 4-*a* is a cross sectional view of the speaker box (29) of this invention and FIG. 4-*b* is a top view of the speaker box (29) showing speaker (30). The height of the speaker box (29) is in the range of 10 to 50 cm. Diameter of the speaker box (29) is in the range of 10 to 50 cm. Thickness of the box (29) material is in the ranges of 0.01 to 5 cm. The lower end (31) of the box (29) is blocked with the same material of the cylindrical part (21). The lower end (31) of the box (29) has a hole (32) at the center for electricity wire connected to the speaker (30). The diameter of this hole (32) is in the range of 2 to 10 cm. A male thread screw (33) is carved at the: outer side of the upper part (34) of the box.

The speaker box (29) and the speaker cover box (21) are assembled in one set as shown in FIG. 2 for amplifying a deep bass sound. Assembling means for the two parts (21) and (29) is, including but not limited to, a thread screw; flange, gasket, and bolt and nuts.

The speaker cover box (21) of this invent: ion has the same smoothening effect for any kind of speaker system when instilled at the front of a speaker.

What is claimed is:

1. A novel speaker box system for deep bass amplification consists of: 1) a front speaker cover box, consisting of a cylindrical transparent plastic box with a dimension of 50 cm height by 50 cm diameter by 5 mm thickness, one end of which is, blocked with a circular transparent plastic plate having a center hole of 20 cm diameter, in which a trumpet horn of 20 cm long and 12 cm diameter at the center and 20 cm diameter at both ends is attached, and the inner part of the other side is carved with a female thread screw; and 2) a rear speaker box, consisting of a cylindrical opaque plastic box with a dimension of 50 cm height by 50 cm diameter by 5 mm thickness, one end of which is blocked with the same material and the outer side of the other end is carved with a male screw for assembling with said speaker cover box; and 3) a speaker installed therein facing the speaker cover box.

2. The speaker cover box, in claim 1, is installable at the front face of a conventional speaker.

* * * * *